United States Patent
Kim et al.

(10) Patent No.: US 10,872,944 B2
(45) Date of Patent: Dec. 22, 2020

(54) DISPLAY SUBSTRATE, METHOD OF MANUFACTURING DISPLAY SUBSTRATE, AND DISPLAY DEVICE INCLUDING DISPLAY SUBSTRATE

(71) Applicant: Samsung Display Co., Ltd., Yongin-Si (KR)

(72) Inventors: Sang Gab Kim, Seoul (KR); Hyunmin Cho, Hwaseong-si (KR); Taesung Kim, Incheon (KR); Subin Bae, Hwaseong-si (KR); Yu-Gwang Jeong, Anyang-si (KR); Jinseock Kim, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/681,697

(22) Filed: Nov. 12, 2019

(65) Prior Publication Data
US 2020/0168684 A1    May 28, 2020

(30) Foreign Application Priority Data
Nov. 26, 2018 (KR) .......................... 10-2018-0147314

(51) Int. Cl.
*H01L 27/32* (2006.01)
*H01L 51/52* (2006.01)
*H01L 51/56* (2006.01)

(52) U.S. Cl.
CPC ...... *H01L 27/3258* (2013.01); *H01L 51/5218* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 7,446,037 | B2 | 11/2008 | Alford et al. |
| 7,888,263 | B2 | 2/2011 | Alford et al. |
| 8,120,017 | B2 * | 2/2012 | Lee ..................... H01L 27/3276 257/40 |
| 9,029,850 | B2 | 5/2015 | Lee et al. |
| 9,406,736 | B2 | 8/2016 | Park et al. |

(Continued)

FOREIGN PATENT DOCUMENTS

| KR | 10-0709255 B1 | 4/2007 |
| KR | 10-0789090 B1 | 12/2007 |

(Continued)

*Primary Examiner* — Thien F Tran
(74) *Attorney, Agent, or Firm* — Innovation Counsel LLP

(57) ABSTRACT

A method of manufacturing a display substrate may include the following steps: forming a drain electrode on a pixel area of a substrate; forming a pad electrode on a pad area of the substrate; forming an inorganic insulation layer that covers the drain electrode and the pad electrode; forming an organic insulation member that has a first thickness at the pixel area of the substrate, has a second thickness less than the first thickness at the pad area of the substrate, exposes a first portion of the inorganic insulation layer on the drain electrode, and exposes a second portion of the inorganic insulation layer on the pad electrode; removing the first portion of the inorganic insulation layer and the second portion of the inorganic insulation layer; and partially removing the organic insulation member.

13 Claims, 15 Drawing Sheets

(56) References Cited

U.S. PATENT DOCUMENTS

| | | | | |
|---|---|---|---|---|
| 2016/0190456 A1* | 6/2016 | You | ............... | H01L 27/3258 |
| | | | | 257/40 |
| 2016/0247870 A1* | 8/2016 | Park | ............... | H01L 51/5218 |
| 2017/0278867 A1 | 9/2017 | Jeong et al. | | |
| 2018/0061895 A1 | 3/2018 | Kim et al. | | |

FOREIGN PATENT DOCUMENTS

| | | |
|---|---|---|
| KR | 10-1725993 B1 | 4/2017 |
| KR | 10-2018-0015326 A | 2/2018 |
| KR | 10-2018-0025382 A | 3/2018 |
| KR | 10-2018-0032249 A | 3/2018 |

\* cited by examiner

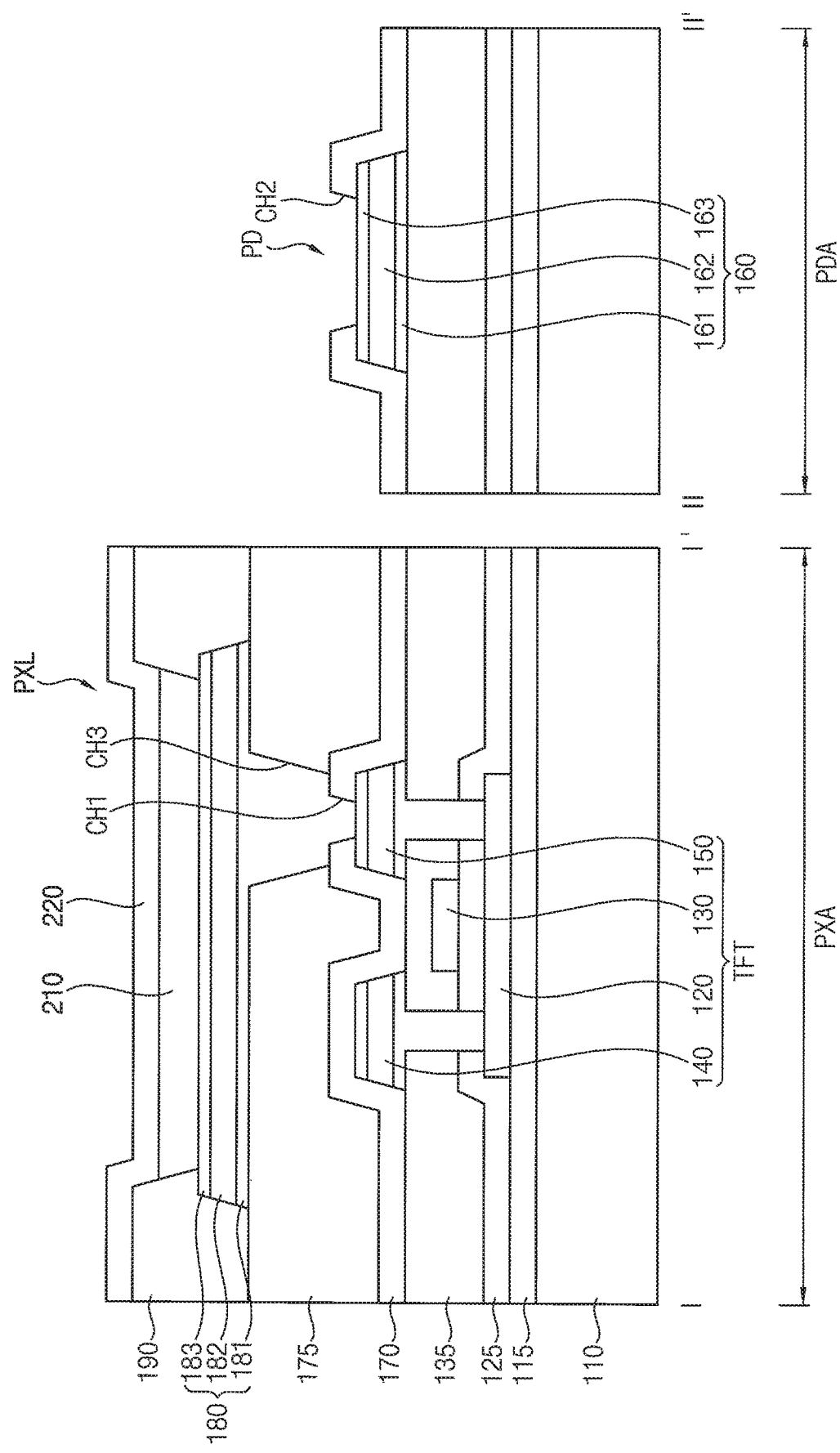

DISPLAY SUBSTRATE, METHOD OF MANUFACTURING DISPLAY SUBSTRATE, AND DISPLAY DEVICE INCLUDING DISPLAY SUBSTRATE

CROSS-REFERENCE TO RELATED APPLICATION(S)

This application claims priority under 35 USC § 119 to Korean Patent Application No. 10-2018-0147314 filed on Nov. 26, 2018 in the Korean Intellectual Property Office (KIPO); the entire disclosure of the Korean Patent Application is incorporated by reference herein.

BACKGROUND

1. Field

The technical field relates to a display substrate, a method of manufacturing the display substrate, and a display device including the display substrate.

2. Description of the Related Art

A display device (such as an organic light emitting display device) may include pixels formed in a pixel area and may include pads formed in a peripheral area adjacent to the pixel area. In the manufacturing process of the display device, a conductive layer may be etched for forming electrodes of the pixels. When the conductive layer is etched, the pads may contact ions released from the conductive layer and may be undesirably corroded. As a result, the quality of the display device may be unsatisfactory.

SUMMARY

Embodiments may be related a method of manufacturing a display substrate. In the method, undesirable corrosion of a pad electrode may be prevented in an etching process of a pixel electrode layer.

Embodiments may be related to a display substrate including a pad electrode that is not undesirably corroded. Embodiments may be related to a display device including the display substrate.

A method of manufacturing a display substrate according to embodiments may include forming an semiconductor member in a pixel area on a substrate, forming a gate electrode on the semiconductor member, forming a source electrode and a drain electrode on the gate electrode, the source electrode and the drain electrode being in contact with the semiconductor member, forming a pad electrode in a pad area on the substrate, forming an inorganic insulation layer on the substrate, the inorganic insulation layer covering the source electrode, the drain electrode, and the pad electrode, forming an organic insulation member on the inorganic insulation layer, the organic insulation member having a first thickness in the pixel area and a second thickness less than the first thickness in the pad area, and the organic insulation member exposing a first portion of the inorganic insulation layer on the drain electrode and a second portion of the inorganic insulation layer on the pad electrode, etching the first portion and the second portion of the inorganic insulation layer using an etching gas, and ashing the organic insulation member.

In an embodiment, the source electrode, the drain electrode, and the pad electrode may be substantially simultaneously formed.

In an embodiment, the pad electrode may include an intermediate layer including aluminum (Al), and a lower layer and an upper layer respectively disposed on a lower surface and an upper surface of the intermediate layer.

In an embodiment, the inorganic insulation layer may be formed of silicon nitride.

In an embodiment, the organic insulation member may be formed using a halftone mask.

In an embodiment, forming the organic insulation member may include forming an organic insulation layer on the inorganic insulation layer, exposing the organic insulation layer to a light using the halftone mask, and developing the organic insulation layer.

In an embodiment, a light transmitting portion of the halftone mask may correspond to the first portion and the second portion of the inorganic insulation layer, a light shielding portion of the halftone mask may correspond to the pixel area outside the first portion of the inorganic insulation layer, and a light transflective portion of the halftone mask may correspond to the pad area outside the second portion of the inorganic insulation layer.

In an embodiment, the second portion of the inorganic insulation layer may be disposed on a portion of an upper surface of the pad electrode.

In an embodiment, the etching gas may include fluorine (F).

In an embodiment, the organic insulation member may be ashed by a thickness greater than the second thickness and less than the first thickness.

In an embodiment, the organic insulation member may be ashed by a thickness less than the second thickness.

In an embodiment, the method may further include forming a pixel electrode layer on the ashed organic insulation member, the pixel electrode layer being in contact with the drain electrode and the pad electrode, and etching a portion of the pixel electrode layer in the pad area.

In an embodiment, the pixel electrode layer may include an intermediate layer including silver (Ag), and a lower layer and an upper layer respectively disposed on a lower surface and an upper surface of the intermediate layer.

A display substrate according to embodiments may include a substrate including a pixel area and a pad area, an semiconductor member disposed in the pixel area on the substrate, a gate electrode disposed on the semiconductor member, a source electrode and a drain electrode disposed on the gate electrode, the source electrode and the drain electrode being in contact with the semiconductor member, a pad electrode disposed in the pad area on the substrate, a passivation layer covering the source electrode, the drain electrode, and the pad electrode, the passivation layer including a first contact hole that exposes a portion of an upper surface of the drain electrode and a second contact hole that exposes a portion of an upper surface of the pad electrode, a first planarization layer disposed in the pixel area on the passivation layer, the first planarization layer including a third contact hole that corresponds to the first contact hole, and a pixel electrode disposed in the pixel area on the first planarization layer, the pixel electrode being in contact with the drain electrode through the first contact hole and the third contact hole.

In an embodiment, the source electrode, the drain electrode, and the pad electrode may be disposed on substantially the same level over the substrate.

In an embodiment, the pad electrode may include an intermediate layer including aluminum (Al), and a lower layer and an upper layer respectively disposed on a lower surface and an upper surface of the intermediate layer.

In an embodiment, the passivation layer may cover a side surface of the intermediate layer of the pad electrode.

In an embodiment, the passivation layer may include silicon nitride.

In an embodiment, the passivation layer may cover a side surface of the pad electrode.

In an embodiment, a width of the third contact hole may be greater than a width of the first contact hole.

In an embodiment, the display substrate may further include a second planarization layer disposed in the pad area on the passivation layer, the second planarization layer including a fourth contact hole that corresponds to the second contact hole.

In an embodiment, a thickness of the second planarization layer may be less than a thickness of the first planarization layer.

In an embodiment, the first planarization layer and the second planarization layer may include substantially the same material.

A display device according to embodiments may include a substrate including a pixel area and a pad area, an semiconductor member disposed in the pixel area on the substrate, a gate electrode disposed on the semiconductor member, a source electrode and a drain electrode disposed on the gate electrode, the source electrode and the drain electrode being in contact with the semiconductor member, a pad electrode disposed in the pad area on the substrate, a passivation layer covering the source electrode, the drain electrode, and the pad electrode, the passivation layer including a first contact hole that exposes a portion of an upper surface of the drain electrode and a second contact hole that exposes a portion of an upper surface of the pad electrode, a planarization layer disposed in the pixel area on the passivation layer, the planarization layer including a third contact hole that corresponds to the first contact hole, a pixel electrode disposed in the pixel area on the planarization layer, the pixel electrode being in contact with the drain electrode through the first contact hole and the third contact hole, an emission layer disposed on the pixel electrode, and an opposite electrode disposed on the emission layer.

An embodiment may be related to a method for manufacturing a display substrate. The method may include the following steps: forming a semiconductor member that overlaps a pixel area of a substrate; forming a gate electrode that overlaps the semiconductor member; forming a source electrode and a drain electrode that directly contact the semiconductor member; forming a pad electrode that overlaps a pad area of the substrate; forming an inorganic insulation layer that covers each of the source electrode, the drain electrode, and the pad electrode; forming an organic insulation member on the inorganic insulation layer, wherein the organic insulation member has a first positive maximum thickness in a direction perpendicular to the substrate at the pixel area of the substrate, has a second positive maximum thickness in the direction perpendicular to the substrate less than the first thickness at the pad area of the substrate, exposes a first portion of the inorganic insulation layer on the drain electrode, and exposes a second portion of the inorganic insulation layer on the pad electrode; removing the first portion of the inorganic insulation layer and the second portion of the inorganic insulation layer using an etching gas; and partially removing the organic insulation member to form a planarization layer.

The source electrode, the drain electrode, and the pad electrode may be simultaneously formed.

The pad electrode may include an intermediate layer including aluminum (Al) and may include two conductive layers respectively disposed on two opposite surfaces of the intermediate layer.

The inorganic insulation layer may be formed of silicon nitride.

The organic insulation member may be formed using a halftone mask.

The step of forming the organic insulation member may include the following sub-steps: forming an organic insulation layer on the inorganic insulation layer; exposing the organic insulation layer to a light using the halftone mask; and partially removing the organic insulation layer.

The method may include the following steps: positioning a first light transmitting portion of the halftone mask and a second light transmitting portion of the halftone mask over the first portion of the inorganic insulation layer and the second portion of the inorganic insulation layer, respectively; positioning a light shielding portion of the halftone mask over the pixel area of the substrate, wherein the light shielding portion of the halftone mask exposes the first portion of the inorganic insulation layer; and positioning a light transflective portion of the halftone mask over the pad area of the substrate, wherein the light transflective portion of the halftone mask exposes the second portion of the inorganic insulation layer.

The second portion of the inorganic insulation layer may be disposed on a portion of an upper surface of the pad electrode before being removed.

The etching gas may include fluorine (F).

The organic insulation member may be ashed by a thickness greater than or equal to the second positive maximum thickness and less than the first positive maximum thickness to form the planarization layer.

The organic insulation member may be ashed by a thickness less than the second positive maximum thickness to form the planarization layer.

The method may include the following steps: forming a pixel electrode layer on the planarization layer, the pixel electrode layer being in contact with the drain electrode and the pad electrode; and removing a portion of the pixel electrode layer that overlaps the pad area of the substrate.

The pixel electrode layer may include an intermediate layer including silver (Ag) and may include two conductive layers respectively disposed on two opposite surfaces of the intermediate layer.

An embodiment may be related to a display substrate. The display substrate may include the following elements: a substrate including a pixel area and a pad area; an semiconductor member overlapping the pixel area of the substrate; a gate electrode overlapping the semiconductor member; a source electrode and a drain electrode directly contacting the semiconductor member; a pad electrode overlapping the pad area of the substrate; a passivation layer at least partially covering each of the source electrode, the drain electrode, and the pad electrode, the passivation layer including a first contact hole that partially exposes the drain electrode and including a second contact hole that partially exposes the pad electrode; a first planarization layer disposed on the passivation layer, overlapping the pixel area of the substrate, and including a third contact hole that corresponds to the first contact hole; a pixel electrode disposed on the first planarization layer, overlapping the pixel area of the substrate, and directly contacting the drain electrode through the first contact hole and the third contact hole.

The display substrate may include an insulation interlayer. The source electrode, the drain electrode, and the pad electrode may be disposed directly on a same face of the insulation interlayer.

The pad electrode may include an intermediate layer including aluminum (Al) and may include two conductive layers respectively disposed on two opposite surfaces of the intermediate layer.

The passivation layer may cover a side surface of the intermediate layer of the pad electrode.

The passivation layer may include silicon nitride.

The passivation layer may cover a side surface of the pad electrode.

A maximum width of the third contact hole in a direction parallel to the substrate may be greater than a maximum width of the first contact hole in the direction parallel to the substrate.

The display substrate may include a second planarization layer disposed on the passivation layer, overlapping the pad area of the substrate, and including a fourth contact hole that corresponds to the second contact hole.

A maximum thickness of the second planarization layer in a direction perpendicular to the substrate may be less than a maximum thickness of the first planarization layer in a direction perpendicular to the substrate.

The first planarization layer and the second planarization layer may include a same material.

An embodiment may be related to a display device. The display device may include the following elements: a substrate including a pixel area and a pad area; an semiconductor member overlapping the pixel area of the substrate; a gate electrode overlapping the semiconductor member; a source electrode and a drain electrode directly contacting the semiconductor member; a pad electrode overlapping the pad area of the substrate; a passivation layer at least covering each of the source electrode, the drain electrode, and the pad electrode, the passivation layer including a first contact hole that partially exposes the drain electrode and including a second contact hole that partially exposes the pad electrode; a planarization layer disposed on the passivation layer, overlapping the pixel area of the substrate, and including a third contact hole that corresponds to the first contact hole; a pixel electrode disposed on the planarization layer, overlapping the pixel area of the substrate, and directly contacting the drain electrode through the first contact hole and the third contact hole; an emission layer disposed on the pixel electrode; and an opposite electrode disposed on the emission layer.

In embodiments, an organic insulating member may be formed using a halftone mask and may function as a etch-stopper for forming a passivation layer, so that a manufacturing cost and a manufacturing time of a display substrate may be minimized.

In embodiments, a passivation layer may prevent a pad electrode from being undesirably corroded. Advantageously, satisfactory quality of a display substrate may be attained.

BRIEF DESCRIPTION OF THE DRAWINGS

FIG. 15 is a cross-sectional view illustrating a display device according to an embodiment.

DETAILED DESCRIPTION OF EMBODIMENTS

Example embodiments are described with reference to the accompanying drawings.

Although the terms "first," "second," etc. may be used herein to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The term "connect" may mean "electrically connect." The term "conductive" may mean "electrically conductive." The term "insulate" may mean "electrically insulate." The term "contact" may mean "directly mechanically contact" or "direct mechanical contact." The term "surface" may mean "face." The term "planarized" may mean "flat" or "substantially flat." The term "upper" may mean "image-displaying-direction." The term "above" an element may mean "farther from the base substrate" than the element. A list of materials may mean at least one of the listed materials. The term "various methods" may mean "at least one of various methods." A list of methods may mean at least one of the listed methods.

Figure 1:
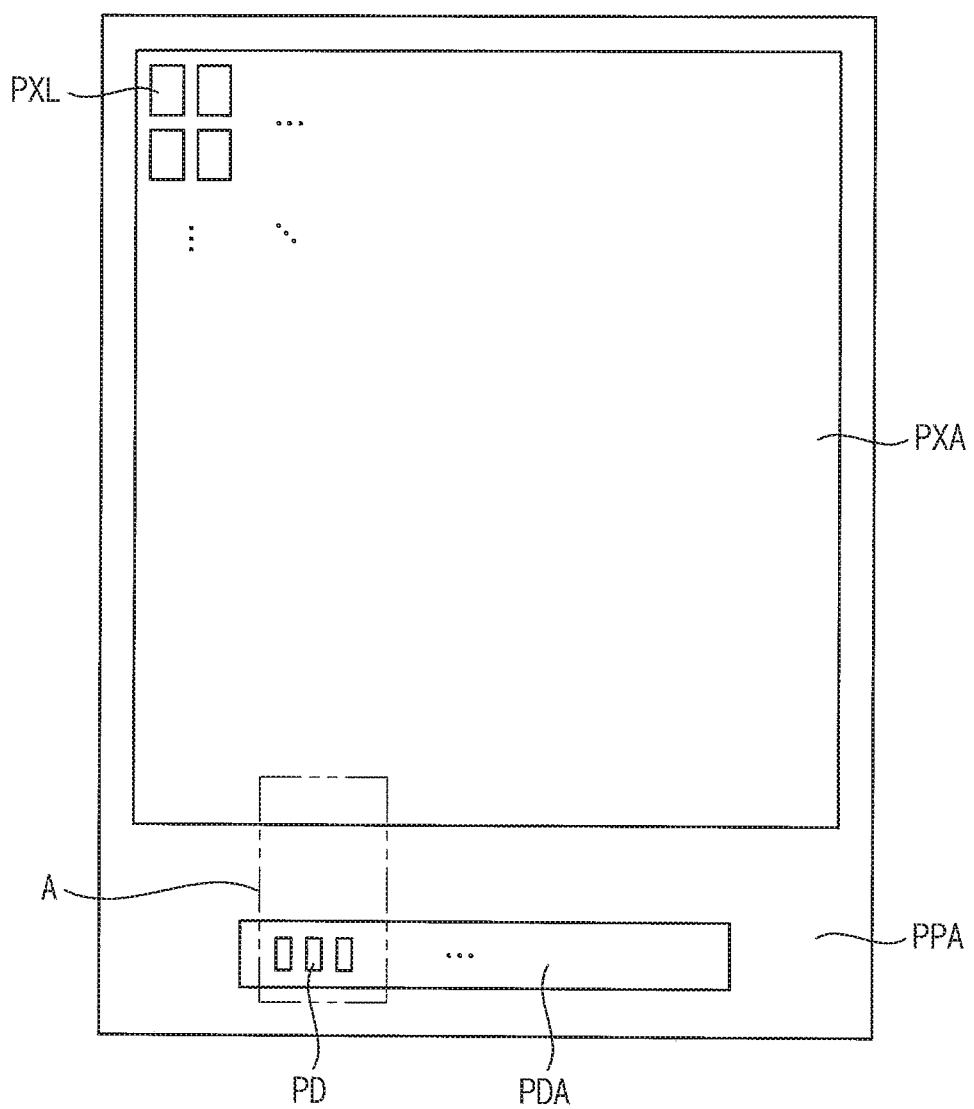
FIG. 1 is a plan view illustrating a display substrate according to an embodiment.

FIG. 1 is a plan view illustrating a display substrate according to an embodiment.

Referring to FIG. 1, a display substrate according to an embodiment may include a pixel area PXA and a peripheral area PPA. A plurality of pixels PXL may be disposed in the pixel area PXA. The pixel area PXA may display an image based on light emitted from the pixels PXL.

The peripheral area PPA may be adjacent to the pixel area PXA. The peripheral area PPA may be located at one or more sides of the pixel area PXA. For example, the peripheral area PPA may surround the pixel area PXA. The peripheral area PPA may include a pad area PDA in which a plurality of pads PD are disposed. An integrated circuit (IC) chip may be directly connected to the pad area PDA, or may be connected to the pad area PDA through a flexible printed circuit board (FPCB). Therefore, signals for driving the pixels PXL may be provided from the IC chip to the display substrate.

Figure 2:
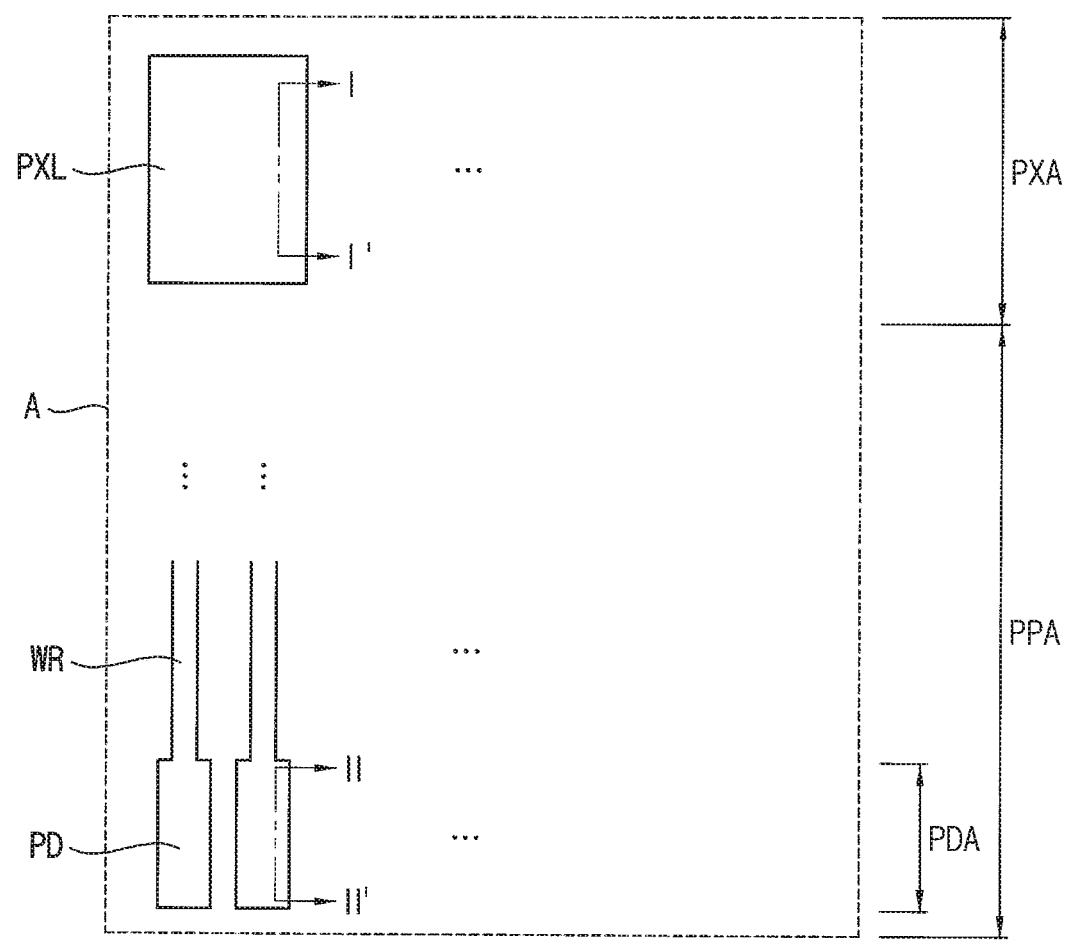
FIG. 2 is a plan view illustrating an area A in FIG. 1 according to an embodiment.
Figure 3:
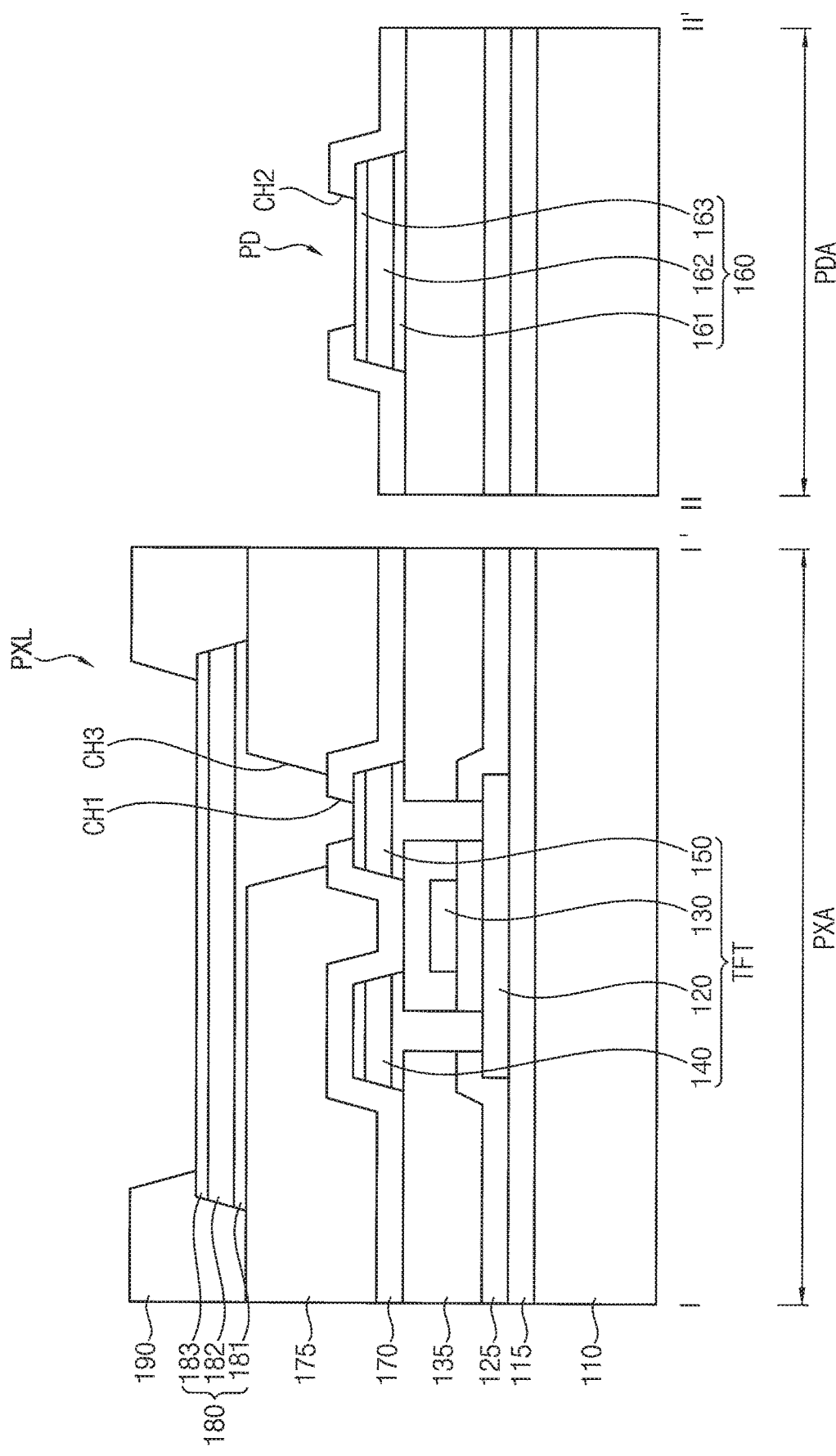
FIG. 3 is a cross-sectional view illustrating a display substrate according to an embodiment.

FIG. 2 is a plan view illustrating an area A in FIG. 1 according to an embodiment. FIG. 3 is a cross-sectional view illustrating a display substrate according to an embodiment. FIG. 3 may illustrate portions of the display substrate taken along a line I-I' and a line II-II' in FIG. 2.

Referring to FIGS. 2 and 3, the display substrate may include a substrate 110 (which may include a pixel area and a pad area respectively corresponding to the pixel area PXA and the pad area PDA), the pixels PXL disposed in the pixel area PXA on the substrate 110 (and overlapping the corresponding pixel area of the substrate 110), and the pads PD disposed in the pad area PDA on the substrate 110 (and overlapping the corresponding pad area of the substrate 110). Each of the pixels PXL may include a thin film transistor TFT and a pixel electrode 180 connected to the thin film transistor TFT. Each of the pads PD may include a pad electrode 160. The pixels PXL and the pads PD may be electrically connected via wires WR disposed between the pixels PXL and the pads PD.

The substrate 110 may be a transparent or opaque insulating substrate. For example, the substrate 110 may include glass or plastic such as polyimide (PI), polycarbonate (PC), polyethersulfone (PES), polyethylene terephthalate (PET), polyacrylate, etc.

A buffer layer 115 may be disposed on the substrate 110. The buffer layer 115 may be disposed in the pixel area PXA and the peripheral area PPA. The buffer layer 115 may block impurities such as oxygen, moisture, etc. from reaching the thin film transistor TFT. The buffer layer 115 may provide a planarized upper surface. The buffer layer 115 may include silicon nitride, silicon oxide, silicon oxynitride, etc. In an embodiment, the buffer layer 115 may be unnecessary.

The thin film transistor TFT may be disposed on the buffer layer 115. The thin film transistor TFT may be disposed in the pixel area PXA. The thin film transistor TFT may include an semiconductor member 120, a gate electrode 130, a source electrode 140, and a drain electrode 150. In an embodiment, the thin film transistor TFT may have a top-gate structure in which the gate electrode 130 is disposed above the semiconductor member 120 relative to the substrate 110. In an embodiment, the thin film transistor TFT may have a bottom-gate structure in which a gate electrode is disposed between a semiconductor member and a base substrate.

The semiconductor member 120 may be disposed on the buffer layer 115. The semiconductor member 120 may be formed of amorphous silicon, polysilicon, an oxide semiconductor, etc. The semiconductor member 120 may include a source region, a drain region, and a channel region formed between the source region and the drain region.

A gate insulation layer 125 covering the semiconductor member 120 may be disposed on the buffer layer 115. The gate insulation layer 125 may be disposed in the pixel area PXA and the peripheral area PPA. The gate insulation layer 125 may insulate the gate electrode 130 from the semiconductor member 120. The gate insulation layer 125 may include silicon nitride, silicon oxide, silicon oxynitride, etc.

The gate electrode 130 may be disposed on the gate insulation layer 125. The gate electrode 130 may overlap the channel region of the semiconductor member 120. The gate electrode 130 may include a metal such as molybdenum (Mo), aluminum (Al), copper (Cu), etc. or an alloy.

An insulation interlayer 135 covering the gate electrode 130 may be disposed on the gate insulation layer 125. The insulation interlayer 135 may be disposed in the pixel area PXA and the peripheral area PPA. The insulation interlayer 135 may insulate the source electrode 140 and the drain electrode 150 from the gate electrode 130. The insulation interlayer 135 may include silicon nitride, silicon oxide, silicon oxynitride, etc.

The source electrode 140 and the drain electrode 150 may be disposed on the insulation interlayer 135. The source electrode 140 and the drain electrode 150 may be respectively connected to the source area and the drain area of the semiconductor member 120 through contact holes formed in the insulation interlayer 135 and the gate insulation layer 125.

The pad electrode 160 may be disposed on the substrate 110. The pad electrode 160 may be disposed in the pad area PDA of the display substrate and may overlap the corresponding pad area of the substrate 110.

In an embodiment, the pad electrode 160 may be disposed at substantially the same level as the source electrode 140 and the drain electrode 150 over the substrate 110. For example, the source electrode 140, the drain electrode 150, and the pad electrode 160 may be disposed directly on an upper surface of the insulation interlayer 135.

In an embodiment, the pad electrode 160 may include a lower layer 161, an intermediate layer 162, and an upper layer 163 which are sequentially stacked. The lower layer 161 may be disposed on a lower surface of the intermediate layer 162, and the upper layer 163 may be disposed on an upper surface of the intermediate layer 162. A thickness of the lower layer 161, a thickness of the intermediate layer 162, and a thickness of the upper layer 163 may be about 500 Å, about 4000 Å, and about 500 Å, respectively.

In an embodiment, the lower layer 161, the intermediate layer 162, and the upper layer 163 of the pad electrode 160 may include titanium (Ti), aluminum (Al), and titanium (Ti), respectively. The intermediate layer 162 of the pad electrode 160 may serve as a main electrode layer, and the lower layer 161 and the upper layer 163 of the pad electrode 160 may serve as auxiliary electrode layers for protecting the lower surface and the upper surface of the intermediate layer 162, respectively.

In an embodiment, the source electrode 140, the drain electrode 150, and the pad electrode 160 may include substantially the same material. For example, each of the source electrode 140 and the drain electrode 150 may have a multilayer structure including Ti—Al—Ti like the pad electrode 160.

A passivation layer 170 at least partially covering each of the source electrode 140, the drain electrode 150, and the pad electrode 160 may be disposed on the insulation interlayer 135. The passivation layer 170 may be disposed in the pixel area PXA and the peripheral area PPA. The passivation layer 170 may be formed along a profile of the insulation interlayer 135, the source electrode 140, the drain electrode 150, and the pad electrode 160 over the substrate 110. In an embodiment, a thickness of the passivation layer 170 may be about 4000 Å.

The passivation layer 170 may include a first contact hole CH1 and a second contact hole CH2 that pass through the passivation layer 170. The first contact hole CH1 may expose a portion of an upper surface of the source electrode 140 or the drain electrode 150. For example, the first contact hole CH1 may expose a center portion of the upper surface of the drain electrode 150. The second contact hole CH2 may expose a portion of an upper surface of the pad electrode 160. For example, the second contact hole CH2 may expose a center portion of the upper surface of the pad electrode 160.

The passivation layer 170 may cover a side surface of the pad electrode 160. The side surface of the pad electrode 160 may not be exposed. In an embodiment, the passivation layer 170 may cover at least a side surface of the intermediate layer 162 of the pad electrode 160. The side surface of the intermediate layer 162 of the pad electrode 160 may not be exposed.

The passivation layer 170 may include an inorganic insulation material. In an embodiment, the passivation layer 170 may include silicon nitride. In an embodiment, the passivation layer 170 may include silicon oxide, silicon oxynitride, etc.

A planarization layer 175 may be disposed on the passivation layer 170. The planarization layer 175 may be disposed in the pixel area PXA and may not be disposed in the peripheral area PPA (including the pad area PDA). The planarization layer 175 may overlap the pixel area of the substrate 110 and may not overlap the pad area of the substrate 110. The planarization layer 175 may have a planarized upper surface. The planarization layer 175 may provide the planarized surface. The planarization layer 175 may include an organic insulation material such as acryl based resin, epoxy based resin, polyimide based resin, polyester based resin, etc. In an embodiment, a thickness of the planarization layer 175 may be about 2 μm.

The planarization layer 175 may include a third contact hole CH3 that passes through the planarization layer 175. The third contact hole CH3 may correspond to the first contact hole CH1. The third contact hole CH3 may be disposed above the first contact hole CH1. The center portion of the upper surface of the drain electrode 150 may be exposed by the first contact hole CH1 and the third contact hole CH3.

In an embodiment, a maximum width of the third contact hole CH3 in a direction parallel to the substrate 110 may be greater than a maximum width of the first contact hole CH1 in the direction parallel to the substrate 110. The third contact hole CH3 may expose a portion of the passivation layer 170 which covers an edge of the upper surface of the drain electrode 150 in addition to the center portion of the upper surface of the drain electrode 150.

The pixel electrode 180 may be disposed on the planarization layer 175. The pixel electrode 180 may be disposed in the pixel area PXA and may overlap the pixel area of the substrate 110. The pixel electrode 180 may be connected to the source electrode 140 or the drain electrode 150 of the thin film transistor TFT. For example, the pixel electrode 180 may be in contact with the drain electrode 150 through the first contact hole CH1 and the third contact hole CH3.

The pixel electrode 180 may include silver (Ag). Silver ions (Ag$^+$) may be generated when silver (Ag) included in the pixel electrode 180 reacts with an etchant in an etching process for forming the pixel electrode 180. The silver ions (Ag$^+$) may be in contact with the center portion of the upper surface of the pad electrode 160 if the pad electrode 160 is not protected.

If the silver ions (Ag$^+$) generated in the etching process for forming the pixel electrode 180 contact the aluminum (Al) included in the pad electrode 160, aluminum particles may be oxidized to generate aluminum ions (Al$^{3+}$), and the silver ions (Ag$^+$) may be reduced to form silver particles. The aluminum (Al) may be corroded because of the generation of the aluminum ion (Al$^{3+}$). According to embodiments, since the passivation layer 170 covers at least the side surfaces of the pad electrode 160 (including at least the side surfaces of the intermediate layer 162), the aluminum (Al) included in the pad electrode 160 may not be exposed; therefore, potential corrosion of the pad electrode 160 due to contact with silver ions (Ag$^+$) may be prevented.

In an embodiment, the pixel electrode 180 may include a lower layer 181, an intermediate layer 182, and an upper layer 183 which are sequentially stacked. The lower layer 181 may be disposed on a lower surface of the intermediate layer 182, and the upper layer 183 may be disposed on an upper surface of the intermediate layer 182.

In an embodiment, the lower layer 181, the intermediate layer 182, and the upper layer 183 of the pixel electrode 180 may include indium tin oxide (ITO), silver (Ag), and indium tin oxide (ITO), respectively. The intermediate layer 182 of the pixel electrode 180 may serve as a main electrode layer, and the lower layer 181 and the upper layer 183 of the pixel electrode 180 may serve as auxiliary electrode layers for protecting the lower surface and the upper surface of the intermediate layer 182, respectively.

A pixel defining layer 190 covering edges of the pixel electrode 180 may be disposed on the planarization layer 175. The pixel defining layer 190 may be disposed in the pixel area PXA and may not be disposed in the peripheral area PPA (including the pad area PDA). The pixel defining layer 190 may overlap the pixel area PXA of the substrate 110 and may not overlap the pad area of the substrate 110. The pixel defining layer 190 may include an opening portion exposing an upper surface of the pixel electrode 180, thereby defining an emission area. The pixel defining layer 190 may include an organic insulation material such as acryl based resin, epoxy based resin, polyimide based resin, polyester based resin, etc.

FIGS. 4, 5, 6, 7, 8, 9, 10, and 11 are cross-sectional views illustrating structures formed in a method of manufacturing a display substrate (e.g., the display substrate illustrated in FIG. 3) according to an embodiment.

Figure 4:
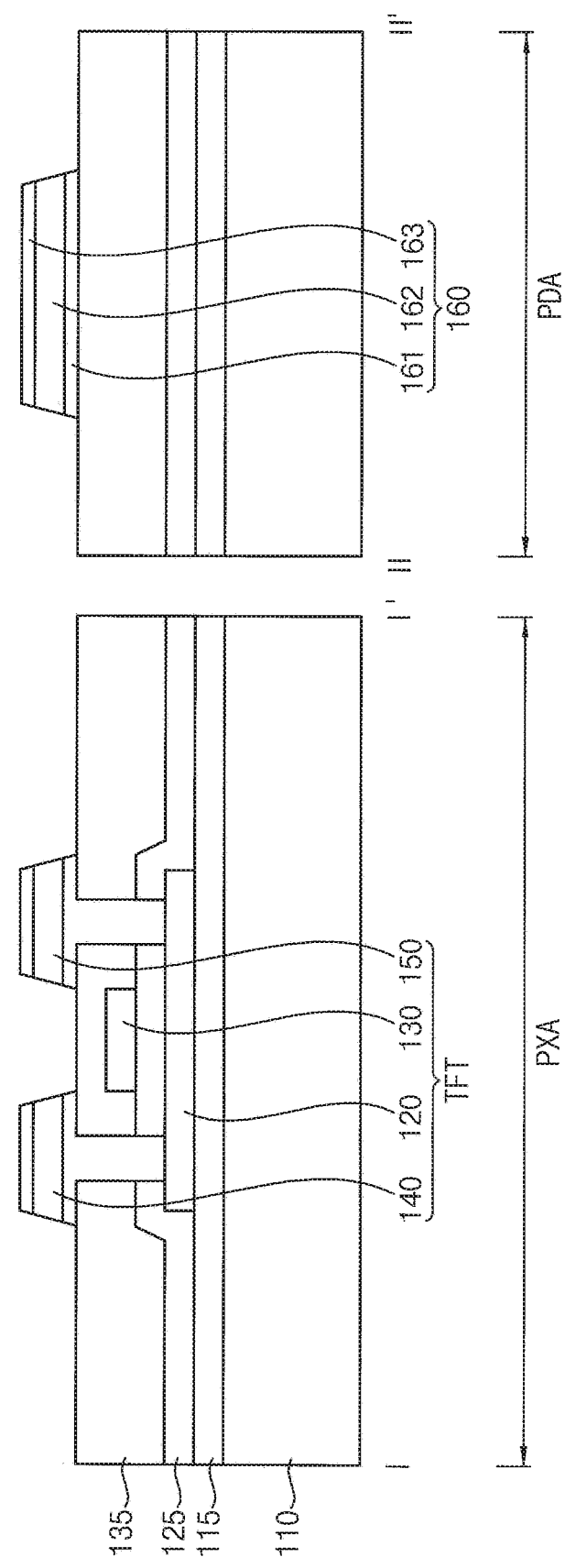
FIG. 4, FIG. 5, FIG. 6, FIG. 7, FIG. 8, FIG. 9, FIG. 10, and FIG. 11 are cross-sectional views illustrating structures formed in a method of manufacturing a display substrate according to an embodiment.

Referring to FIG. 4, the thin film transistor TFT and the pad electrode 160 may be formed on the substrate 110.

The buffer layer 115 may be formed in the pixel area PXA and the pad area PDA on the substrate 110. For example, the buffer layer 115 may be formed of silicon oxide, silicon nitride, silicon oxynitride, etc. using at least one of various methods, such as at least one of chemical vapor deposition (CVD), sputtering, etc.

Subsequently, the semiconductor member 120 may be formed in the pixel area PXA on the buffer layer 115. For example, a layer including a material containing silicon, an oxide semiconductor, etc. may be formed on an entire surface of the buffer layer 115, and the layer may be partially removed to form the semiconductor member 120. When the semiconductor member 120 is formed using the material containing silicon, an amorphous silicon layer may be formed on the entire surface of the buffer layer 115, and the amorphous silicon layer may be crystallized to form a polysilicon layer. Subsequently, the polysilicon layer may be partially removed to form the semiconductor member 120.

Subsequently, the gate insulation layer 125 covering the semiconductor member 120 may be formed in the pixel area PXA and the pad area PDA on the buffer layer 115. The gate insulation layer 125 may be formed of silicon oxide, silicon nitride, silicon oxynitride, etc.

Subsequently, the gate electrode 130 may be formed in the pixel area PXA on the gate insulation layer 125. The gate electrode 130 may overlap the semiconductor member 120. The gate electrode may be formed of a metal, an alloy thereof, etc. Subsequently, impurities may be doped at opposite ends of the semiconductor member 120 using the gate electrode 130 as a mask to form the source region, the drain region, and the channel region of the semiconductor member 120, wherein the channel region is disposed between the source region and the drain region.

Subsequently, the insulation interlayer 135 covering the gate electrode 130 may be formed in the pixel area PXA and the pad area PDA on the gate insulation layer 125. The insulation interlayer 135 may be formed of silicon oxide, silicon nitride, silicon oxynitride, etc.

Subsequently, contact holes exposing portions of the semiconductor member 120 may be formed in the insulation interlayer 135 and the gate insulation layer 125. The contact holes may expose the source region and the drain region of the semiconductor member 120, respectively.

Subsequently, the source electrode 140 and the drain electrode 150 may be formed in the pixel area PXA on the insulation interlayer 135. In addition, the pad electrode 160 may be formed in the pad area PDA on the insulation interlayer 135. For example, a conductive layer filling the contact holes may be formed on an entire surface of the insulation interlayer 135, and the conductive layer may be partially removed to substantially simultaneously form the source electrode 140, the drain electrode 150, and the pad electrode 160.

In an embodiment, the pad electrode 160 may include the lower layer 161, the intermediate layer 162, and the upper layer 163 which are sequentially stacked. For example, a layer including titanium (Ti), a layer including aluminum (Al), and a layer including titanium (Ti) may be sequentially formed on the insulation interlayer 135, and the above layers may be partially removed to form the source electrode 140, the drain electrode 150, and the pad electrode 160 each having a multilayer structure including Ti—Al—Ti.

Figure 5:
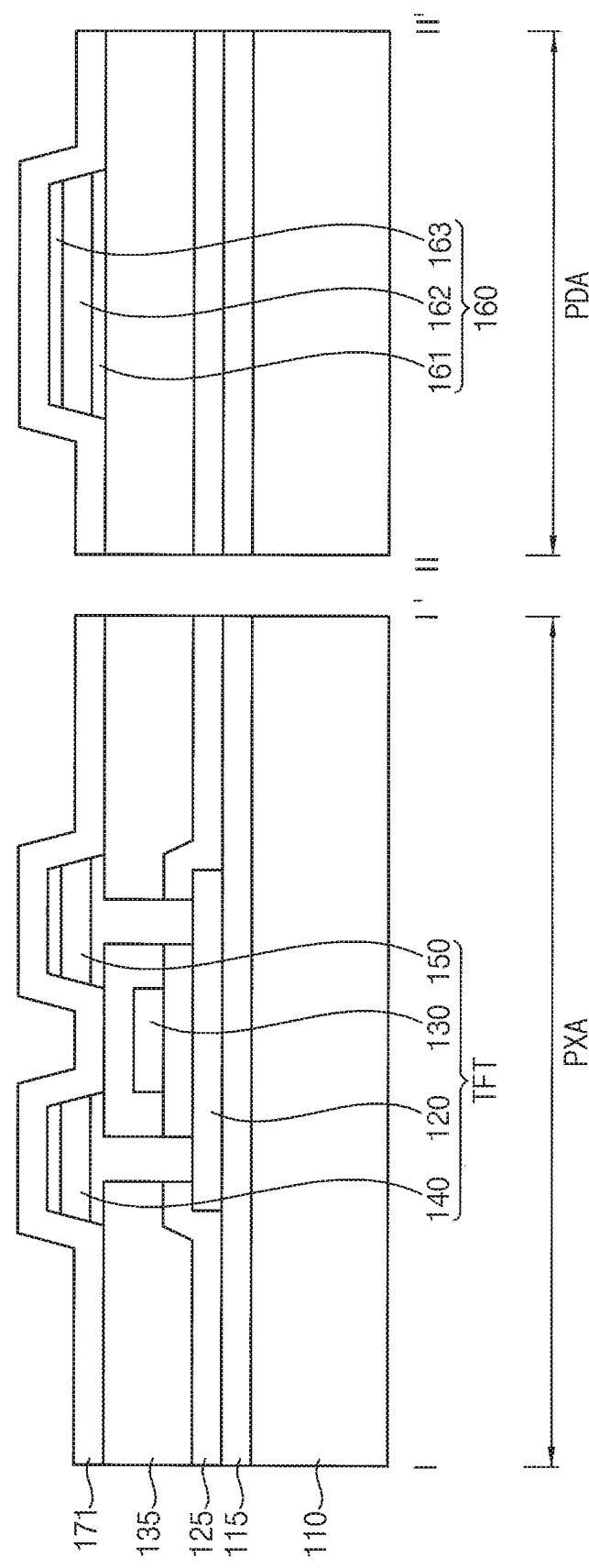

Referring to FIG. 5, an inorganic insulation layer 171 covering the source electrode 140, the drain electrode 150, and the pad electrode 160 may be formed in the pixel area PXA and the pad area PDA on the insulation interlayer 135. The inorganic insulation layer 171 may be formed along a profile of the insulation interlayer 135, the source electrode 140, the drain electrode 150, and the pad electrode 160 over the substrate 110. The inorganic insulation layer 171 may be formed of silicon nitride using various methods such as CVD, sputtering, etc.

Figure 6:
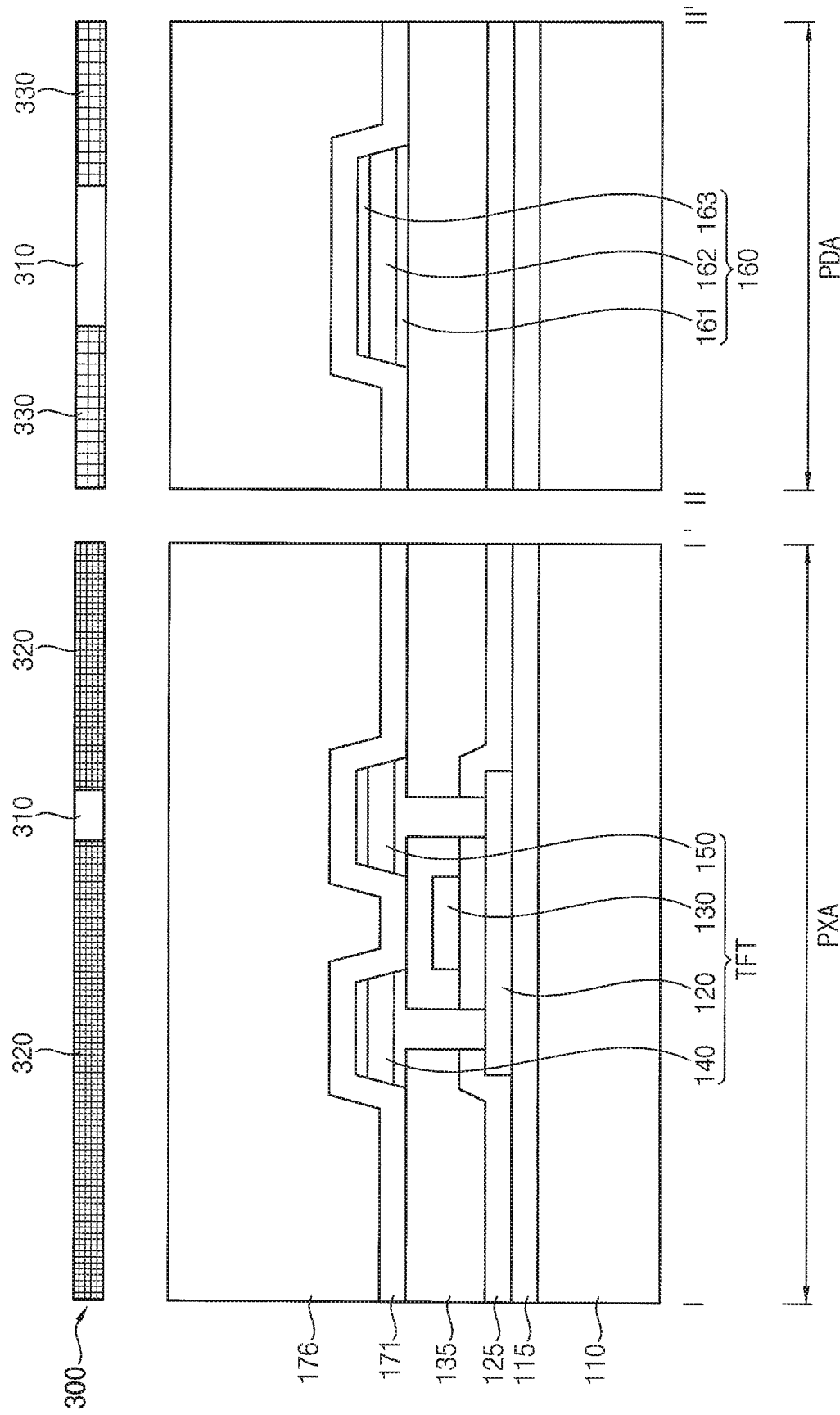

Referring to FIG. 6, an organic insulation layer 176 may be formed on the inorganic insulation layer 171, and the organic insulation layer 176 may be exposed using a photomask 300.

The organic insulation layer 176 may be formed in the pixel area PXA and the pad area PDA on the inorganic insulation layer 171. The organic insulation layer 176 may have a planarized upper surface. In an embodiment, the organic insulation layer 176 may be formed of a positive photosensitive organic material in which a portion exposed to light is removed. The organic insulation layer 176 may be formed of an organic insulation material such as acryl based resin, epoxy based resin, polyimide based resin, polyester based resin, etc.

Subsequently, the photomask 300 may be disposed over the organic insulation layer 176, and the organic insulation layer 176 may be exposed using the photomask 300. In an embodiment, the photomask 300 may be a halftone mask. The halftone mask 300 may include light transmitting portions 310, a light shielding portion 320, and a light transflective portion 330. The light transmitting portions 310 may transmit light, the light shielding portion 320 may block light, and the light transflective portion 330 may transmit a portion of light. A light transmittance of the light transflective portion 330 may be less than a light transmittance of each of the light transmitting portions 310 and greater than a light transmittance of the light shielding portion 320.

Figure 7:
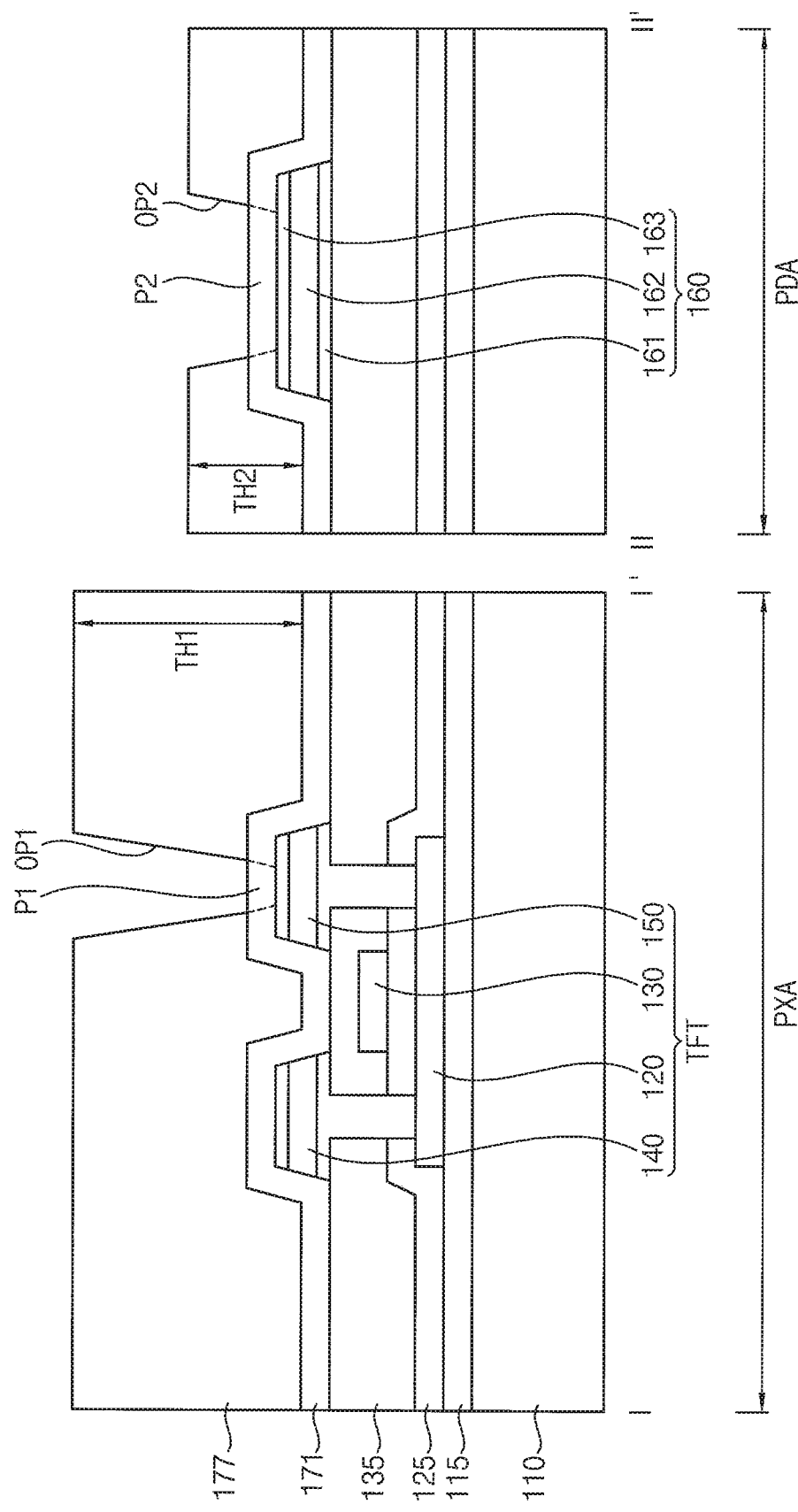

Referring to FIG. 7, an organic insulation member 177 may be formed on the inorganic insulation layer 171.

The organic insulation layer 176 irradiated with light passing through the halftone mask 300 may be developed and partially removed to form the organic insulation member 177. First portions of the organic insulation layer 176 corresponding to the light transmitting portions 310 of the halftone mask 300 may be substantially entirely removed, and a second portion of the organic insulation layer 176 corresponding to the light shielding portion 320 of the halftone mask 300 may not be significantly removed and may remain. A third portion of the organic insulation layer 176 corresponding to the light transflective portion 330 of the halftone mask 300 may be partially removed.

The light transmitting portions 310 of the halftone mask 300 may correspond to a first portion P1 of the inorganic insulation layer 171 on the drain electrode 150 and a second portion P2 of the inorganic insulation layer 171 on the pad electrode 160. The first portion P1 of the inorganic insulation layer 171 may be located on a portion of an upper surface of the drain electrode 150, and the second portion P2 of the inorganic insulation layer 171 may be located on a portion of an upper surface of the pad electrode 160. For example, the first portion P1 of the inorganic insulation layer 171 may be located on a center portion of the upper surface of the drain electrode 150, and the second portion P2 of the inorganic insulation layer 171 may be located on a center portion of the upper surface of the pad electrode 160.

The light shielding portion 320 of the halftone mask 300 may correspond to the pixel area PXA and may expose the first portion P1 of the inorganic insulation layer 171, and the light transflective portion 330 of the halftone mask 300 may correspond to the pad area PDA and may expose the second portion P2 of the inorganic insulation layer 171. Therefore, in the organic insulation member 177, a first portion corresponding to the light shielding portion 320 has a first maximum thickness TH1 in a direction perpendicular to the substrate 110, and a second portion corresponding to the light transflective portion 330 has a second maximum thickness TH2 in the direction perpendicular to the substrate 110 less than the first thickness TH1. A first maximum thickness TH1 may be positioned between the thin film transistor TFT and an immediately neighboring thin film transistor, between the source electrode 140 and the drain electrode 150, between the drain electrode 150 and a second maximum thickness TH2, and/or between the drain electrode 150 and the pad area PDA. A second maximum thickness TH2 may be between a first maximum thickness TH1 and the pad electrode 160, between the pixel area PXA and the pad electrode 160, and/or between the pad electrode 160 and an immediately neighboring edge of the substrate 110. The organic insulation member 177 may include a first opening OP1 exposing the first portion P1 of the inorganic insulation layer 171 and may include a second opening OP2 exposing the second portion P2 of the inorganic insulation layer 171.

Figure 8:
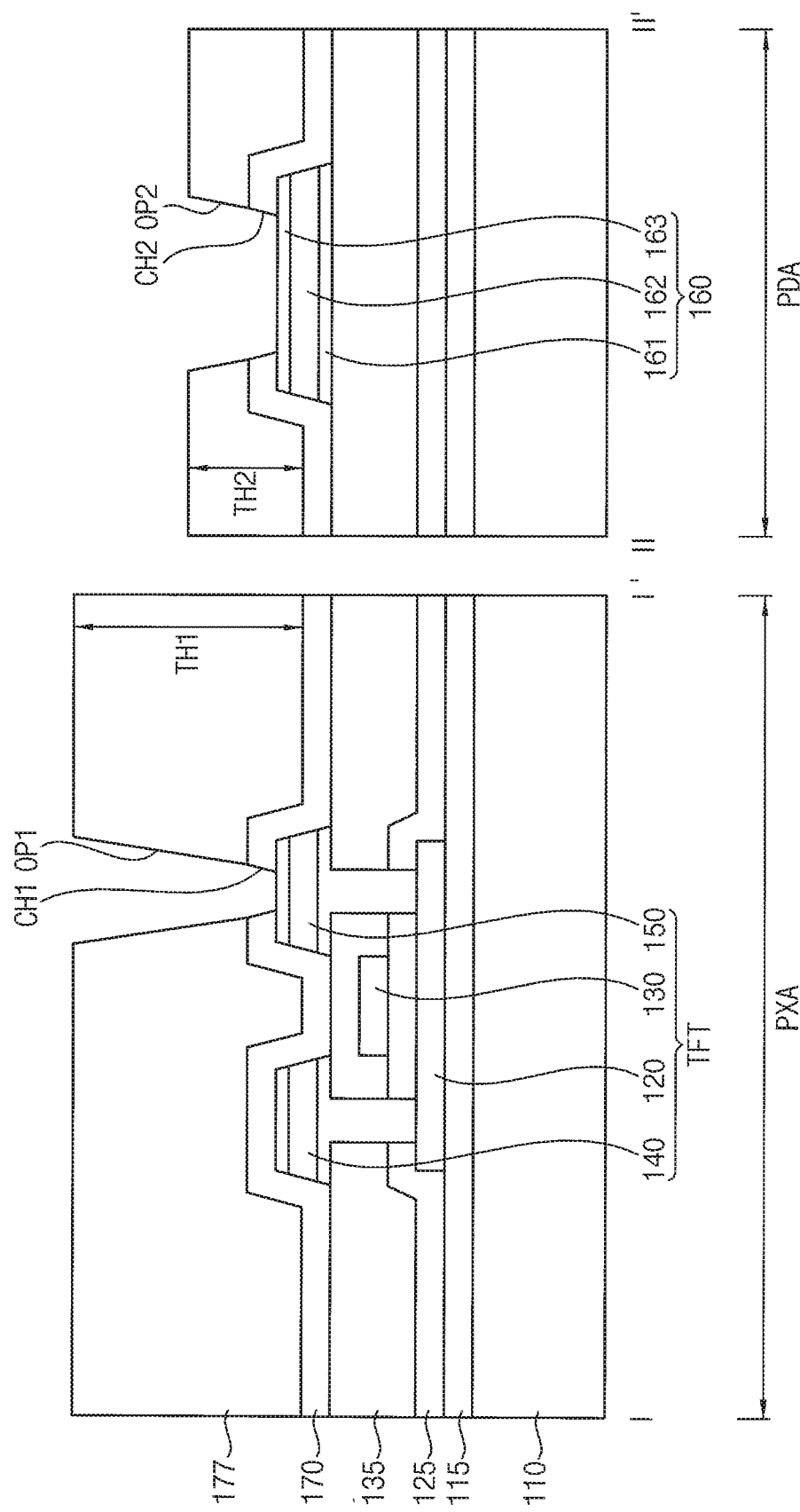

Referring to FIG. 8, the inorganic insulation layer 171 may be etched to form the passivation layer 170.

The inorganic insulation layer 171 may be etched by a dry etching process using an etching gas. In an embodiment, the etching gas may include fluorine (F). The etching gas may include $SF_6$ gas, $WF_6$ gas, $NF_3$ gas, $CF_4$ gas, $C_3F_6$ gas, $C_4F_8$ gas, $CHF_3$ gas, $C_5F_8$ gas, $CH_2F_2$ gas, $C_2HF_5$ gas, $CH_3F$ gas, etc.

The inorganic insulation layer 171 may be etched using the organic insulation member 177 as an etch-stopper. Therefore, the first portion P1 and the second portion P2 of the inorganic insulation layer 171 respectively exposed by the first opening OP1 and the second opening OP2 of the organic insulation member 177 may be etched. As a result, the first contact hole CH1 (exposing a portion of the upper surface of the drain electrode 150) and the second contact hole CH2 (exposing a portion of the upper surface of the pad electrode 160) may be formed. The passivation layer 170 including the first contact hole CH1 and the second contact hole CH2 may be formed on the insulation interlayer 135.

Figure 9:
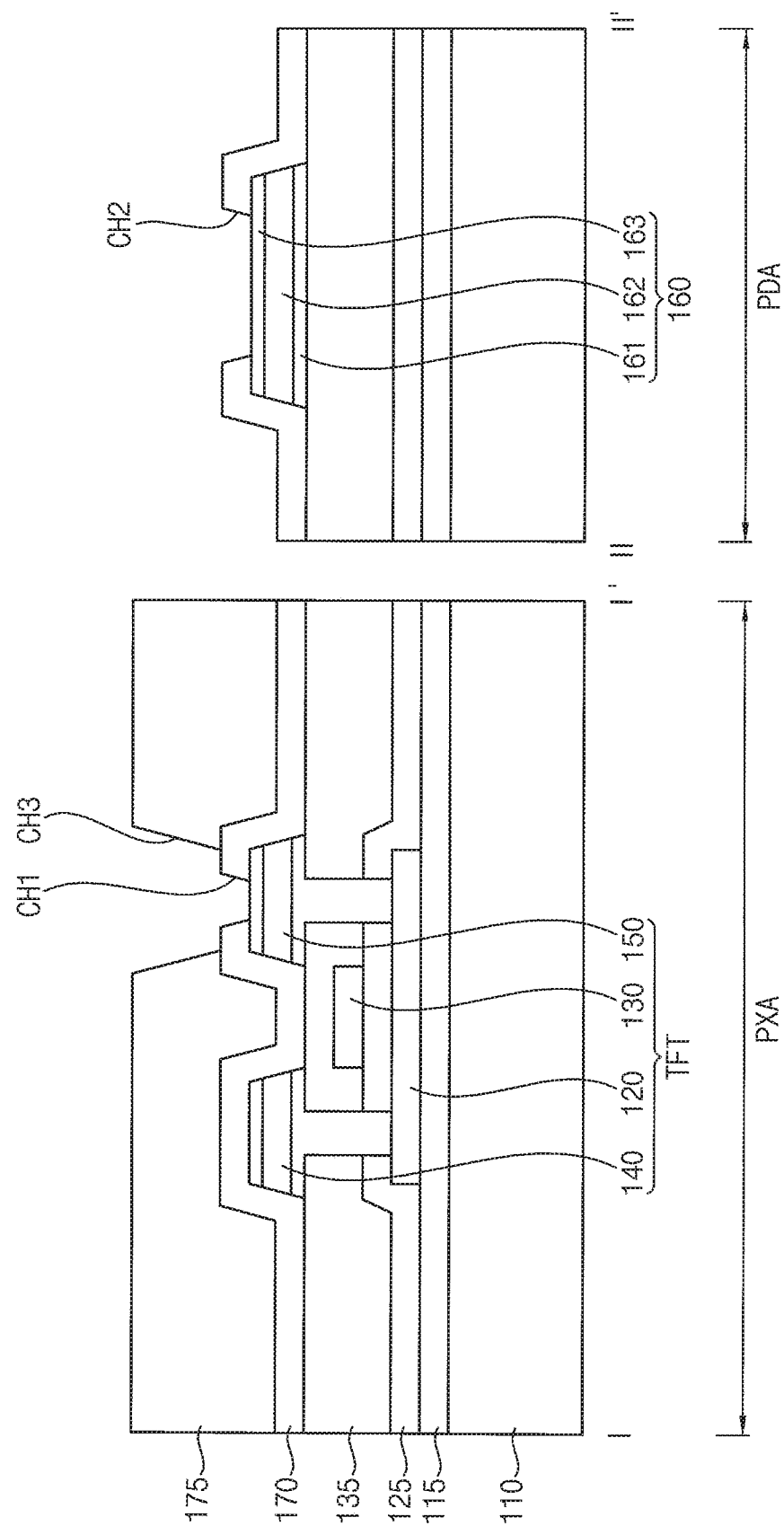

Referring to FIG. 9, the organic insulation member 177 may be ashed and partially removed.

The organic insulation member 177 may be ashed by oxygen plasma using oxygen (O₂) gas. In an embodiment, the organic insulation member 177 may be ashed by a thickness greater than or equal to the second maximum thickness TH2 and less than the first maximum thickness TH1. The second portion of the organic insulation member 177 having the second maximum thickness TH2 in the pad area PDA may be substantially entirely removed, and the first portion of the organic insulation member 177 having the first maximum thickness TH1 in the pixel area PXA may be partially removed. Therefore, the planarization layer 175 that is located in the pixel area PXA and is not located in the pad area PDA may be formed on the passivation layer 170.

A side portion of the organic insulation member 177 exposed by the first opening OP1 may be ashed in addition to an upper portion of the organic insulation member 177. Accordingly, the third contact hole CH3 having a width greater than a width of the first opening OP1 may be formed in the planarization layer 175. The width of the third contact hole CH3 of the planarization layer 175 may be greater than the width of the first contact hole CH1 of the passivation layer 170.

Figure 10:
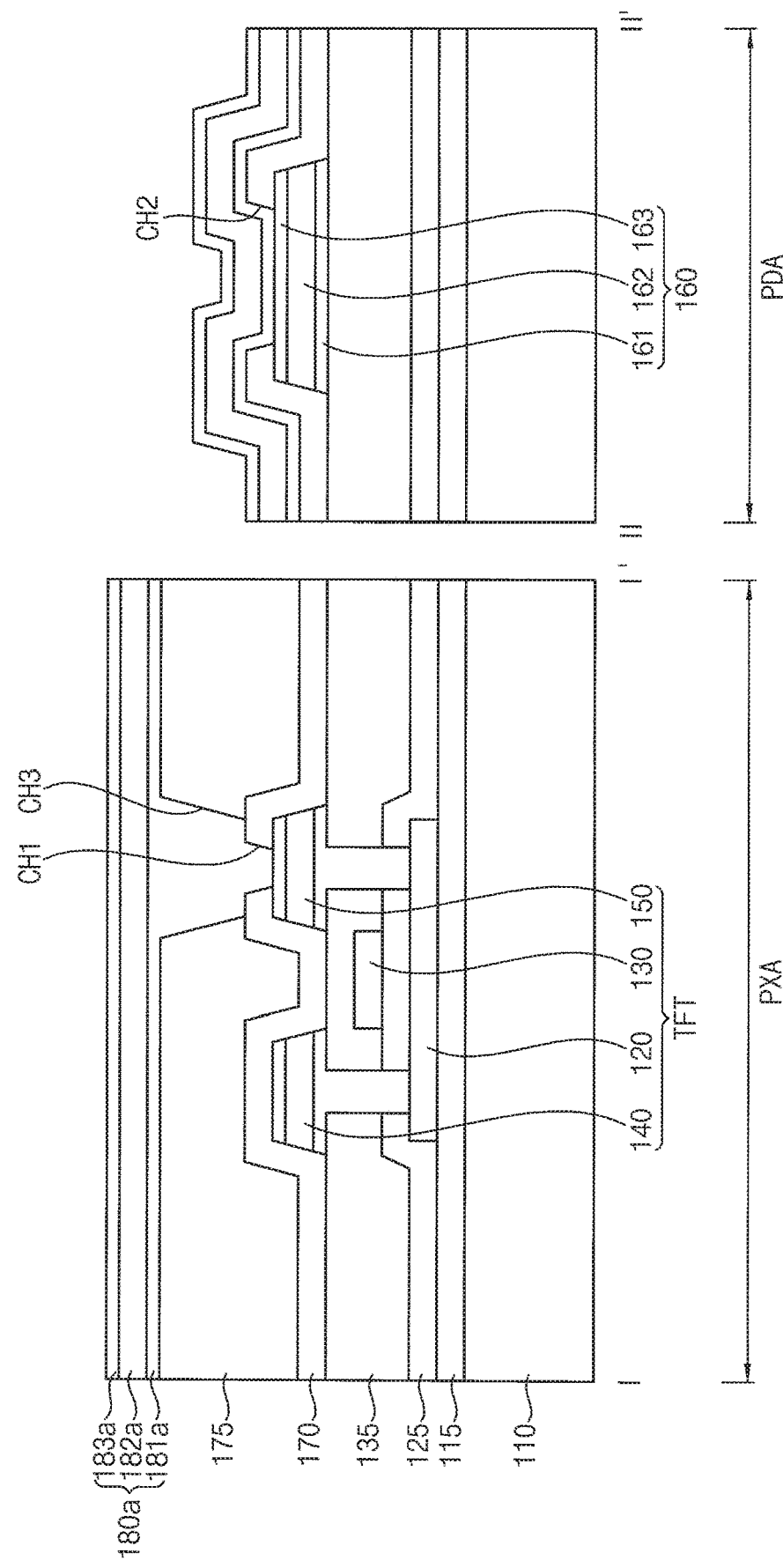

Referring to FIG. 10, a pixel electrode layer 180a may be formed on the planarization layer 175. The pixel electrode layer 180a may be formed on the planarization layer 175 in the pixel area PXA, and may be formed on the passivation layer 170 in the pad area PDA. The pixel electrode layer 180a may be in contact with the drain electrode 150 through the first contact hole CH1 and the third contact hole CH3, and may be in contact with the pad electrode 160 through the second contact hole CH2.

In an embodiment, the pixel electrode layer 180a may include the lower layer 181a, the intermediate layer 182a, and the upper layer 183a which are sequentially stacked. For example, a layer including indium tin oxide (ITO), a layer including silver (Ag), and a layer including indium tin oxide (ITO) may be sequentially formed on the planarization layer 175 to form the pixel electrode layer 180a having a multi-layer structure including ITO—Ag—ITO.

Figure 11:
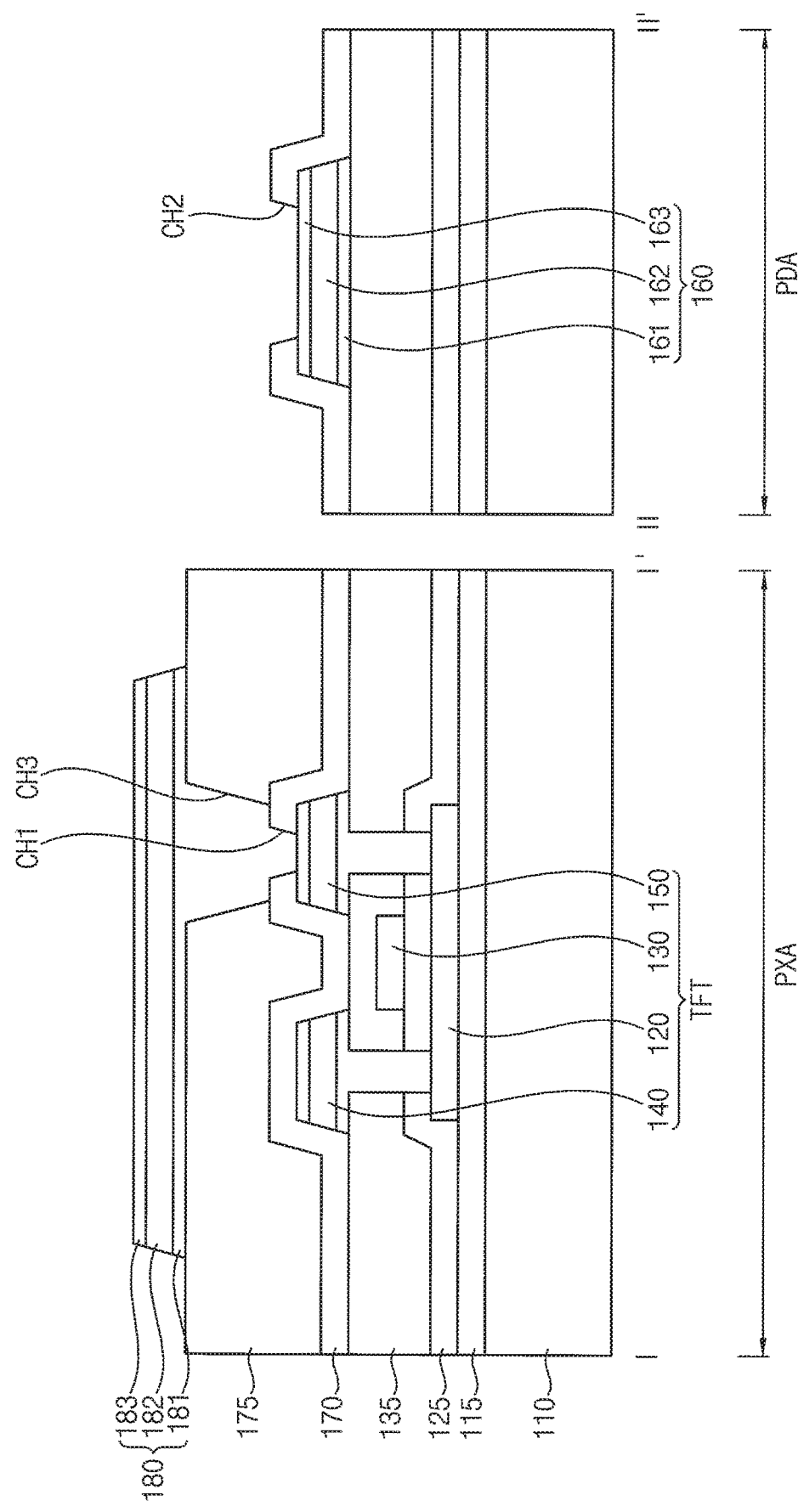

Referring to FIG. 11, the pixel electrode layer 180a may be partially etched to form the pixel electrode 180. The portion of the pixel electrode layer 180a in the pad area PDA may be entirely etched, and the pixel electrode layer 180a in the pixel area PXA may be partially removed to form the pixel electrode 180, which directly contacts the drain electrode 150.

Referring to FIG. 3, the pixel defining layer 190 may be formed in the pixel area PXA on the planarization layer 175. The pixel defining layer 190 may be formed of an organic insulation material such as acryl based resin, epoxy based resin, polyimide based resin, polyester based resin, etc.

According to embodiments, the organic insulation member 177 having different thicknesses in the pixel area PXA and the pad area PDA may be formed using the halftone mask 300, so that the passivation layer 170 may be formed using the organic insulation member 177 as an etch-stopper. Therefore, a manufacturing cost and a manufacturing time for forming the passivation layer 170 and the planarization layer 175 may be reduced.

Figure 12:
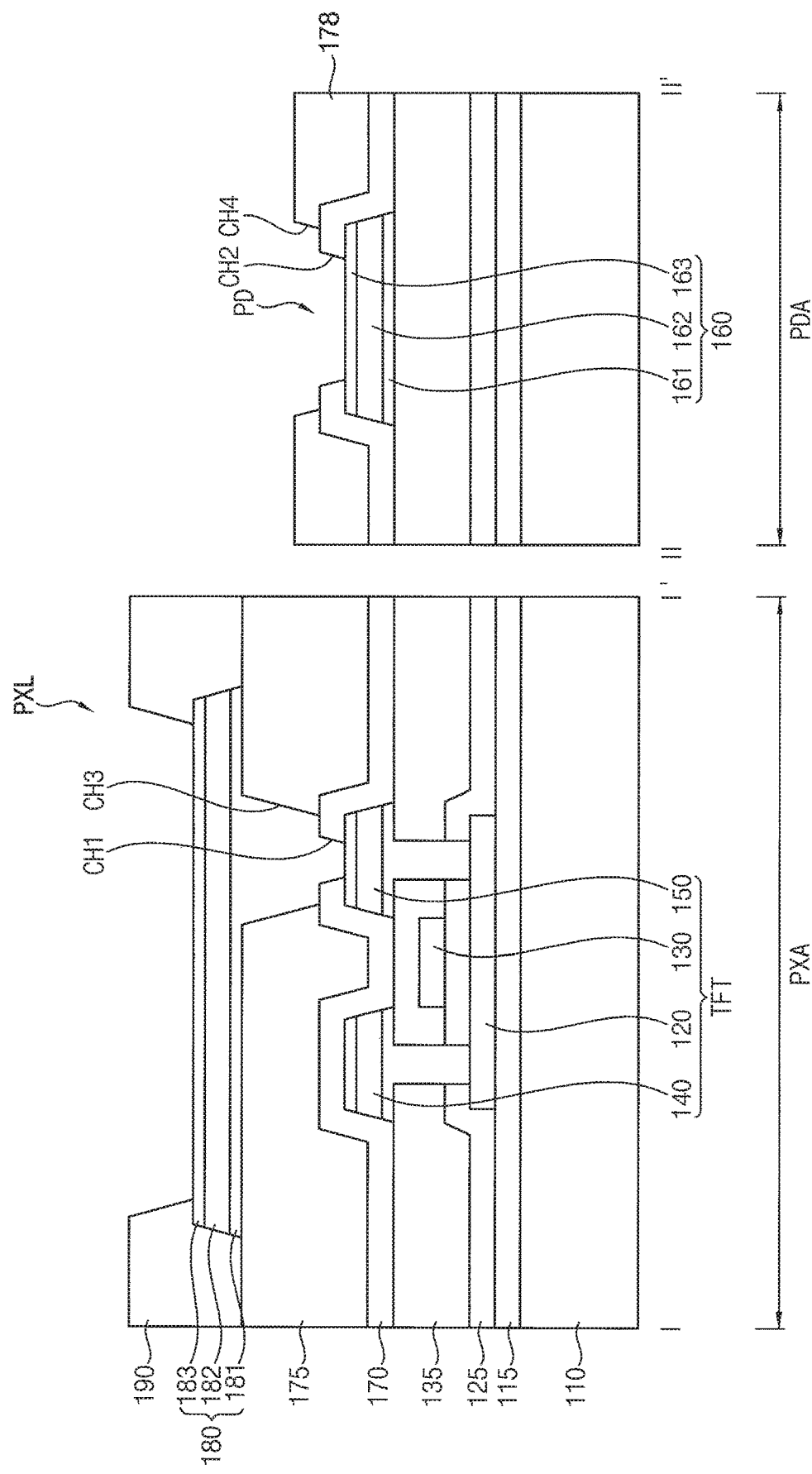
FIG. 12 is a cross-sectional view illustrating a display substrate according to an embodiment.

FIG. 12 is a cross-sectional view illustrating a display substrate according to an embodiment. FIG. 12 may illustrate portions of the display substrate taken along the line I-I' and the line II-II' in FIG. 2.

The display substrate with reference to FIG. 12 is substantially the same as or similar to the display substrate with reference to FIG. 3 except for a second planarization layer. Descriptions of above-described elements may not be repeated.

Referring to FIG. 12, a display substrate according to an embodiment may include a first planarization layer 175 and a second planarization layer 178. The first planarization layer 175 in FIG. 12 may be substantially the same as the planarization layer 175 in FIG. 3.

The first planarization layer 175 and the second planarization layer 178 may be disposed on the passivation layer 170. The first planarization layer 175 may be located in the pixel area PXA, and the second planarization layer 178 may be located in the peripheral area including the pad area PDA. The second planarization layer 178 may have a planarized upper surface. The second planarization layer 178 may be formed of an organic insulation material such as acryl based resin, epoxy based resin, polyimide based resin, polyester based resin, etc. In an embodiment, the first planarization layer 175 and the second planarization layer 178 may include substantially the same material.

In an embodiment, a maximum thickness of the second planarization layer 178 in a direction perpendicular to the substrate 110 may be less than a maximum thickness of the first planarization layer 175 in the direction perpendicular to the substrate 110. For example, the thickness of the first planarization layer 175 may be about 2 μm, and the thickness of the second planarization layer 178 may be less than about 1 μm.

The second planarization layer 178 may include a fourth contact hole CH4 that passes through the second planarization layer 178. The fourth contact hole CH4 may correspond to the second contact hole CH2. The fourth contact hole CH4 may be disposed above the second contact hole CH2. A center portion of an upper surface of the pad electrode 160 may be exposed by the second contact hole CH2 and the fourth contact hole CH4.

In an embodiment, a width of the fourth contact hole CH4 may be greater than a width of the second contact hole CH2. The fourth contact hole CH4 may expose a portion of the passivation layer 170 which covers an edge of the upper surface of the pad electrode 160.

Figure 13:
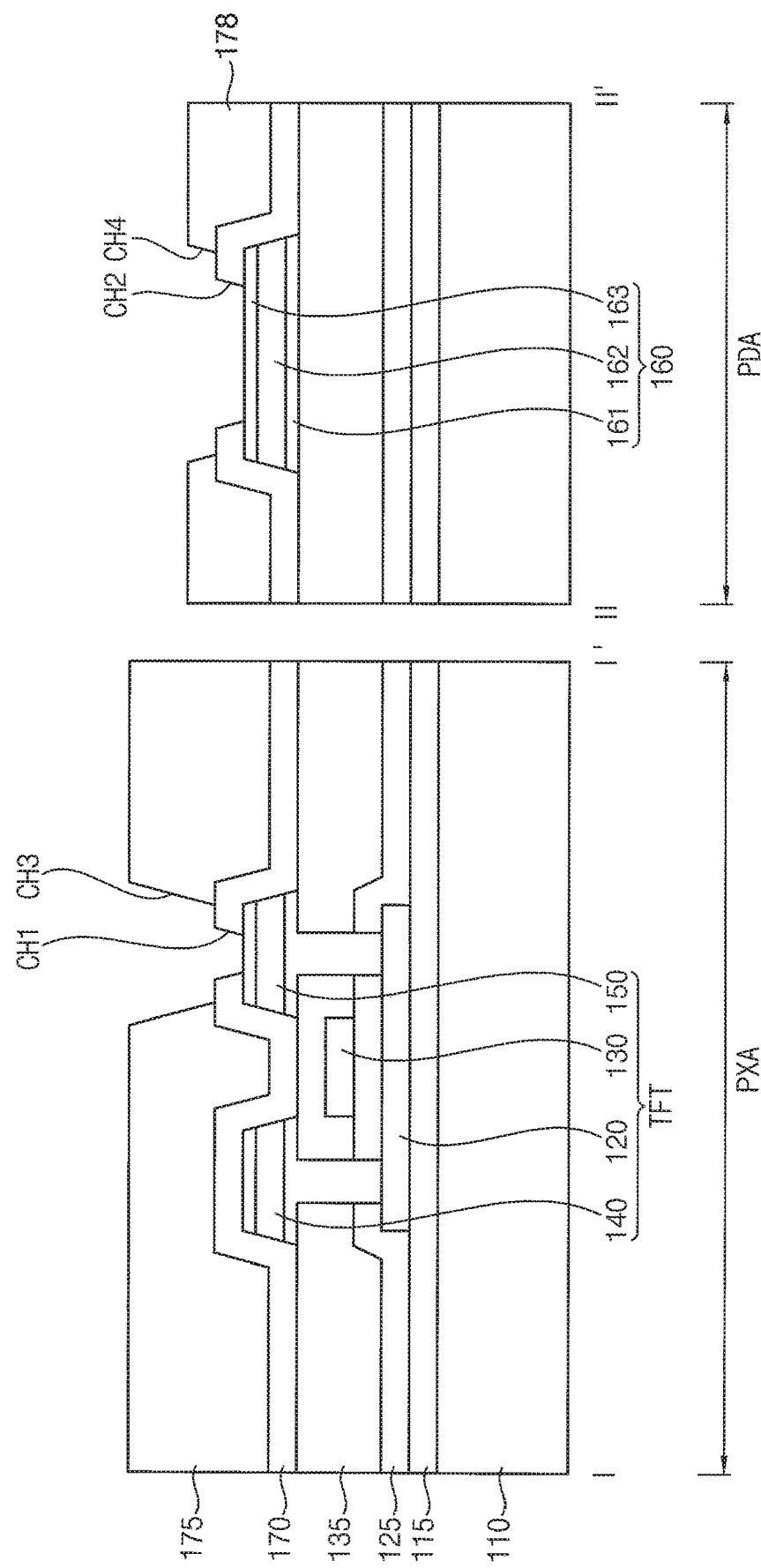
FIG. 13 and FIG. 14 are cross-sectional views illustrating structures formed in a method of manufacturing a display substrate according to an embodiment.
Figure 14:
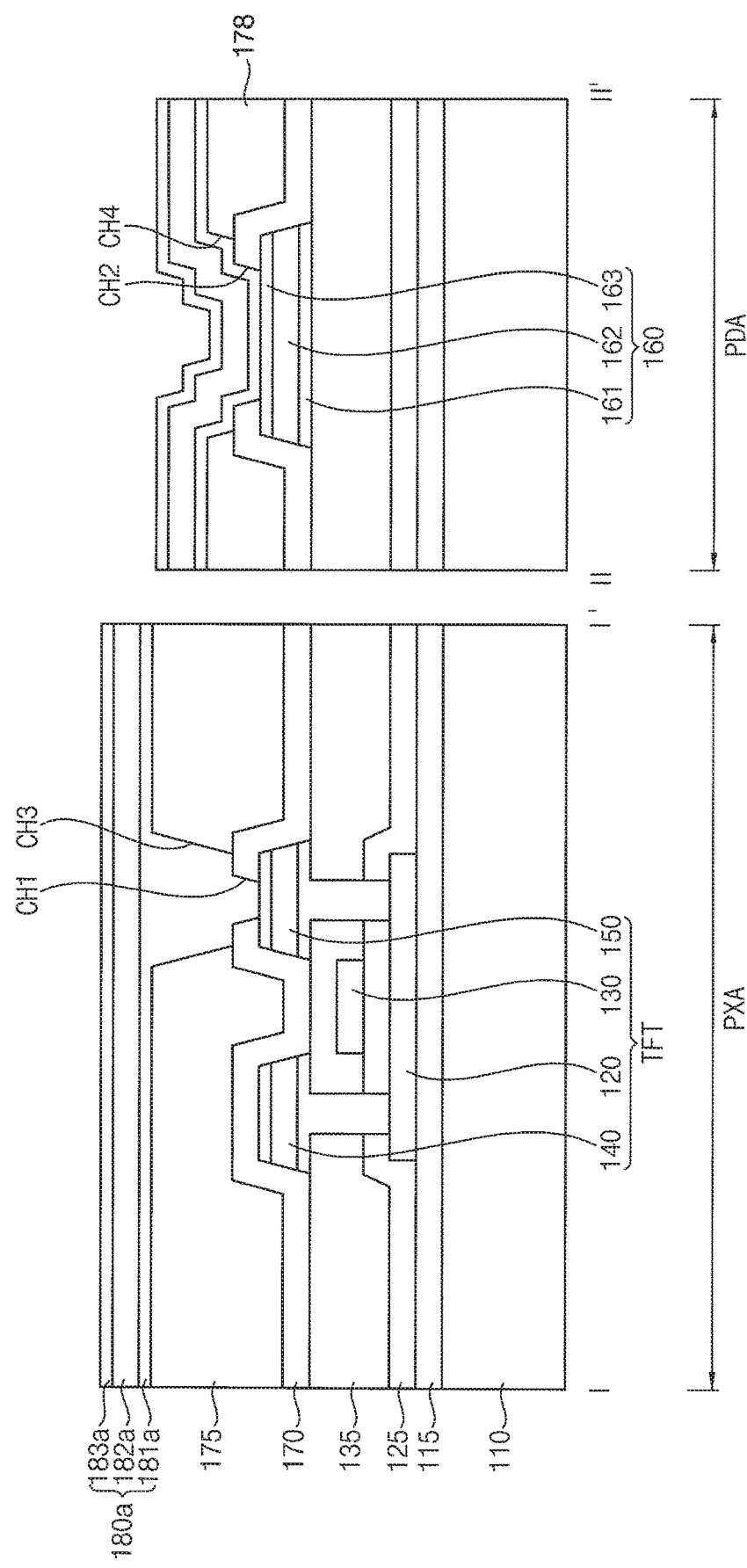

FIGS. 13 and 14 are cross-sectional views illustrating structures formed in a method of manufacturing a display substrate (e.g., the display substrate illustrated in FIG. 12) according to an embodiment.

The method with reference to FIGS. 13 and 14 is substantially the same as or similar to the method with reference to FIGS. 3 to 11 except for formation of the second planarization layer. Descriptions of above-described steps may not be repeated.

Referring to FIG. 8 and FIG. 13, the organic insulation member 177 in FIG. 8 having the first thickness TH1 in the pixel area PXA and the second thickness TH2 in the pad area PDA may be ashed and partially removed.

In an embodiment, the organic insulation member 177 may be ashed by a thickness less than the second thickness TH2. For example, each of a first portion of the organic insulation member 177 having the first thickness TH1 in the pixel area PXA and a second portion of the organic insulation member 177 having the second thickness TH2 in the pad area PDA may be partially removed by substantially the same thickness (less than TH2). Both the first planarization layer 175 located in the pixel area PXA and the second planarization layer 178 located in the pad area PDA may be formed on the passivation layer 170.

Referring to FIG. 8, a side portion of the organic insulation member 177 exposed by the second opening OP2 may be ashed in addition to an upper portion of the organic insulation member 177. Accordingly, the fourth contact hole CH4 having a width greater than a width of the second opening OP2 may be formed in the second planarization layer 178. The width of the fourth contact hole CH4 of the second planarization layer 178 may be greater than the width of the second contact hole CH2 of the passivation layer 170.

Referring to FIG. 14, a pixel electrode layer 180a may be formed on the first planarization layer 175 and the second planarization layer 178. The pixel electrode layer 180a may be formed on the first planarization layer 175 in the pixel area PXA and on the second planarization layer 178 in the pad area PDA. The pixel electrode layer 180a may be in contact with the drain electrode 150 through the first contact hole CH1 and the third contact hole CH3, and may be in contact with the pad electrode 160 through the second contact hole CH2 and the fourth contact hole CH4.

FIG. 15 is a cross-sectional view illustrating a display device according to an embodiment.

Referring to FIG. 15, the display device may include a substrate 110, a pixel PXL disposed in a pixel area PXA on the substrate 110, and a pad PD disposed in a pad area PDA on the substrate 110. The pixel PXL may include a thin film transistor TFT, a pixel electrode 180 connected to the thin film transistor TFT, an emission layer 210, and an opposite electrode 220. The pad PD may include a pad electrode 160.

The display device may include the display substrate illustrated in FIG. 3. In an embodiment, the display device may include the display substrate illustrated in FIG. 12.

The emission layer 210 may be disposed in an opening portion of a pixel defining layer 190. The emission layer 210 may have a thin film multilayer structure including at least a light generation layer (LGL). The emission layer 210 may include a hole injection layer (HIL) for injecting holes and may include a hole transport layer (HTL) having an excellent hole transporting property. The HTL may increase the opportunity for holes and electrons to be re-combined by suppressing the movement of electrons that fail to be combined in the LGL. The LGL may emit light through the re-combination of the injected electrons and holes. The emission layer 210 may include a hole blocking layer (HBL) for suppressing the movement of holes that fail to be combined in the LGL. The emission layer 210 may include an electron transport layer (ETL) for smoothly transporting electrons to the LGL. The emission layer 210 may include an electron injection layer (EIL) for injecting electrons.

A color of light generated in the LGL may be one of red, green, blue, and white. A color of light generated in the LGL of the emission layer 210 may be one of magenta, cyan, and yellow.

The opposite electrode 220 may be disposed on the pixel defining layer 190 and the emission layer 210. The opposite electrode 220 may include a transparent conductive material such as indium tin oxide (ITO), indium zinc oxide (IZO), zinc oxide (ZnO), indium oxide ($In_2O_3$), etc. or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc.

The pixel electrode 180, the emission layer 210, and the opposite electrode 220 may form an organic light emitting element. For example, one of the pixel electrode 180 and the opposite electrode 220 may be an anode electrode of the organic light emitting element, and the other of the pixel electrode 180 and the opposite electrode 220 may be a cathode electrode of the organic light emitting element. For example, the pixel electrode 180 may be the anode electrode, and the opposite electrode 220 may be the cathode electrode.

An embodiment may be applied to an electronic device such as a computer, a notebook, a mobile phone, a smartphone, a smart pad, a PMP, a PDA, an MP3 player, or the like.

Although example embodiments have been described with reference to the drawings, the described embodiments may be modified and changed without departing from the scope defined in the following claims.

What is claimed is:

1. A method of manufacturing a display substrate, the method comprising:
    forming a semiconductor member that overlaps a pixel area of a substrate;
    forming a gate electrode that overlaps the semiconductor member;
    forming a source electrode and a drain electrode that directly contact the semiconductor member;
    forming a pad electrode that overlaps a pad area of the substrate;
    forming an inorganic insulation layer that covers each of the source electrode, the drain electrode, and the pad electrode;
    forming an organic insulation member on the inorganic insulation layer, wherein the organic insulation member has a first positive maximum thickness in a direction perpendicular to the substrate at the pixel area of the substrate, has a second positive maximum thickness in the direction perpendicular to the substrate less than the first thickness at the pad area of the substrate, exposes a first portion of the inorganic insulation layer on the drain electrode, and exposes a second portion of the inorganic insulation layer on the pad electrode;
    removing the first portion of the inorganic insulation layer and the second portion of the inorganic insulation layer using an etching gas; and
    partially removing the organic insulation member to form a planarization layer.

2. The method of claim 1, wherein the source electrode, the drain electrode, and the pad electrode are simultaneously formed.

3. The method of claim 1, wherein the pad electrode includes an intermediate layer including aluminum (Al) and includes two conductive layers respectively disposed on two opposite surfaces of the intermediate layer.

4. The method of claim 1, wherein the inorganic insulation layer is formed of silicon nitride.

5. The method of claim 1, wherein the organic insulation member is formed using a halftone mask.

6. The method of claim 5, wherein forming the organic insulation member includes:
    forming an organic insulation layer on the inorganic insulation layer;
    exposing the organic insulation layer to a light using the halftone mask; and
    partially removing the organic insulation layer.

7. The method of claim 6, comprising:
    positioning a first light transmitting portion of the halftone mask and a second light transmitting portion of the halftone mask over the first portion of the inorganic insulation layer and the second portion of the inorganic insulation layer, respectively;

positioning a light shielding portion of the halftone mask over the pixel area of the substrate, wherein the light shielding portion of the halftone mask exposes the first portion of the inorganic insulation layer; and positioning a light transflective portion of the halftone mask over the pad area of the substrate, wherein the light transflective portion of the halftone mask exposes the second portion of the inorganic insulation layer.

8. The method of claim 1, wherein the second portion of the inorganic insulation layer is disposed on a portion of an upper surface of the pad electrode before being removed.

9. The method of claim 1, wherein the etching gas includes fluorine (F).

10. The method of claim 1, wherein the organic insulation member is ashed by a thickness greater than or equal to the second positive maximum thickness and less than the first positive maximum thickness to form the planarization layer.

11. The method of claim 1, wherein the organic insulation member is ashed by a thickness less than the second positive maximum thickness to form the planarization layer.

12. The method of claim 1, further comprising:
forming a pixel electrode layer on the planarization layer, the pixel electrode layer being in contact with the drain electrode and the pad electrode; and
removing a portion of the pixel electrode layer that overlaps the pad area of the substrate.

13. The method of claim 12, wherein the pixel electrode layer includes an intermediate layer including silver (Ag) and includes two conductive layers respectively disposed on two opposite surfaces of the intermediate layer.

* * * * *